(12) United States Patent
Yamano

(10) Patent No.: US 7,752,750 B2
(45) Date of Patent: Jul. 13, 2010

(54) METHOD OF FORMING WIRING

(75) Inventor: Takaharu Yamano, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 670 days.

(21) Appl. No.: 11/710,933

(22) Filed: Feb. 27, 2007

(65) Prior Publication Data

US 2007/0224809 A1 Sep. 27, 2007

(30) Foreign Application Priority Data

Mar. 1, 2006 (JP) .......................... P2006-055185

(51) Int. Cl.
*H05K 3/02* (2006.01)

(52) U.S. Cl. ...................................... 29/847; 205/125

(58) Field of Classification Search .................. 29/825, 29/846, 847, 852; 156/150; 174/250; 205/78, 205/125; 427/97.2; 430/312, 313, 315; 438/637, 438/687

See application file for complete search history.

(56) References Cited

U.S. PATENT DOCUMENTS

| 4,306,925 A | * | 12/1981 | Lebow et al. | ................. | 29/848 |
| 5,137,618 A | * | 8/1992 | Burnett et al. | ............. | 427/97.2 |
| 6,905,950 B2 | * | 6/2005 | Subramanian et al. | ...... | 438/637 |

FOREIGN PATENT DOCUMENTS

JP 2001-127062 5/2001

* cited by examiner

*Primary Examiner*—Donghai D. Nguyen
(74) *Attorney, Agent, or Firm*—Drinker Biddle & Reath LLP

(57) ABSTRACT

Resist films 19 for liftoff are formed on an insulating layer 12 corresponding to a wiring formation region A so as to expose the insulating layer 12 corresponding to formation positions of first seed layers 14 and thereafter, metal films 21 are formed. Then, the resist films 19 for liftoff are removed and the first and second seed layers 14, 22 are formed. Thereafter, conductive metals 15 are precipitated and grown on the first seed layers 14 by an electrolytic plating method and thereafter the second seed layers 22 are removed and thereby, wirings 13 made of the first seed layers 14 and the conductive metals 15 are formed.

4 Claims, 25 Drawing Sheets

METHOD OF FORMING WIRING

This application claims priority to Japanese Patent Application No. 2006-055185, filed Mar. 1, 2006, in the Japanese Patent Office. The priority application is incorporated by reference in its entirety.

TECHNICAL FIELD

The present disclosure relates to a method of forming wiring, and particularly to a method of forming wiring using an electrolytic plating method.

RELATED ART

In the fields of a semiconductor device, a silicon interposer, MEMS (Micro electro mechanical systems), a wiring substrate, etc., wiring is formed using methods such as a subtractive method or a semi-additive method.

For example, in a related-art wiring formation by semi-additive method, a seed layer is formed by sputtering method etc. over a whole upper surface of a substrate, then a plating resist having openings is formed on the seed layer. The seed layer corresponding to a formation region of wiring is exposed to the openings of the plating resist. Electrolytic plating is carried out by using the seed layer as power feeding layer to form conductive metals on the seed layer exposed to the openings of the plating resists, and sequentially, the plating resist is removed. Finally, an unnecessary portion of the seed layer on which the conductive metals are not formed is removed by etching so that wirings made of the seed layer and the conductive metals are formed. However, in the semi-additive method, when space between wirings becomes narrow by miniaturization of wiring (for example, a space width between wirings becomes 1 μm or less), there was a problem of being difficult to etch a seed layer located between microscopic wirings. A related-art wiring formation method of solving such a problem includes a method as shown in FIGS. 1 to 3. In addition, the microscopic wirings herein mean wiring with, for example, a wiring width of 1 μm or less.

FIGS. 1 to 3 are diagrams showing related-art wiring formation steps.

The related-art wiring formation method will be described with reference to FIGS. 1 to 3.

First, in a step shown in FIG. 1, a resist film 102 having openings 102A is formed on an insulating film 101. The insulating film 101 corresponding to a formation region of wiring 105 is exposed to the openings 102A.

Next, in a step shown in FIG. 2, a seed layer 103 is formed on the insulating film 101 exposed to the openings 102A by an electroless plating method and subsequently, a conductive metal 104 is precipitated and grown on the seed layer 103 by the electroless plating method. Consequently, the wiring 105 made of the seed layer 103 and the conductive metal 104 is formed. Thereafter, in a step shown in FIG. 3, the unnecessary resist film 102 is removed.

By forming the wirings 105 using such a method, the need for a step of removing the seed layer 103 disposed in space between the wirings 105 is eliminated, so that the microscopic wirings 105 can be formed even when a space width between wirings 105 is narrow (for example, see Patent Reference 1: Japanese Patent Unexamined Publication No. 2001-127062).

However, in the related-art method (method shown in FIGS. 1 to 3), the conductive metal 104 is precipitated and grown using the electroless plating method, so that there was a problem in which a thickness of the wiring 105 cannot be formed thickly (for example, about 20 to 30 μm).

Also, in the case of using the electroless plating method, a growth rate of the conductive metal 104 is slow, so that there was a problem in which it takes time to form the wiring and productivity (throughput) decreases.

SUMMARY

Embodiments of the present invention provide a wiring formation method capable of thickly forming a thickness of microscopic wiring and also improving productivity of the wiring.

According to one or more embodiments of the invention, a method of forming wiring, including a seed layer formation step of forming a seed layer on an insulating layer disposed on a substrate by a liftoff method, and a conductive metal formation step of precipitating and growing a conductive metal on the seed layer by an electrolytic plating method using the seed layer as a power feeding layer is provided.

According to one or more embodiments of the invention, by forming a seed layer by a liftoff method, the seed layer is not formed in a region with a narrow space width between wirings, so that the need for a step of removing the seed layer disposed in the region with the narrow space width between the wirings is eliminated, so that the microscopic wirings can be formed even when the space width between the wirings is narrow.

Also, by forming wiring by precipitating and growing a conductive metal using an electrolytic plating method, a thickness of the wiring can be made thicker than the case of precipitating and growing a conductive metal using an electroless plating method.

Further, by precipitating and growing the conductive metal using the electrolytic plating method, the conductive metal can be precipitated and grown at speed higher than that of the electroless plating method, so that productivity (throughput) of the wiring can be improved.

One or more embodiments of the present invention may include one or more the following advantages. For example, according to one or more embodiments of the invention, a thickness of microscopic wiring can be thickly formed and also productivity of the wiring can be improved. Other features and advantages may be apparent from the following detailed description, the accompanying drawings and the claims.

DETAILED DESCRIPTION

Next, embodiments of the invention will be described based on the drawings.

First Embodiment

Figure 4:
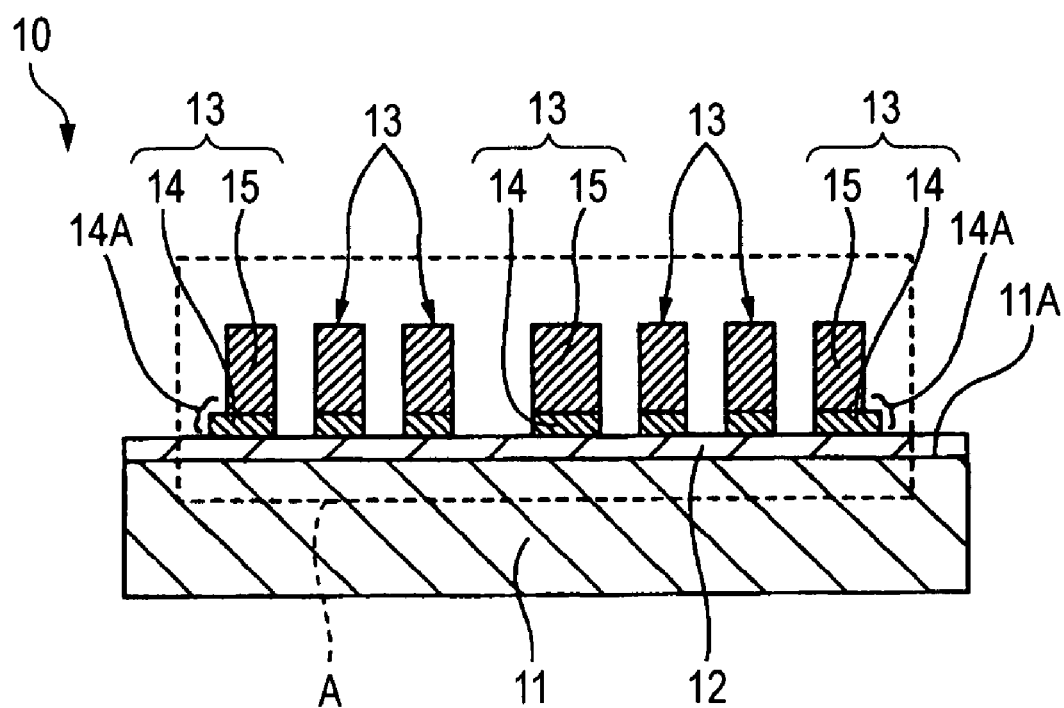
FIG. 4 is a sectional diagram of a wiring substrate according to a first exemplary embodiment of the invention.
Figure 5:
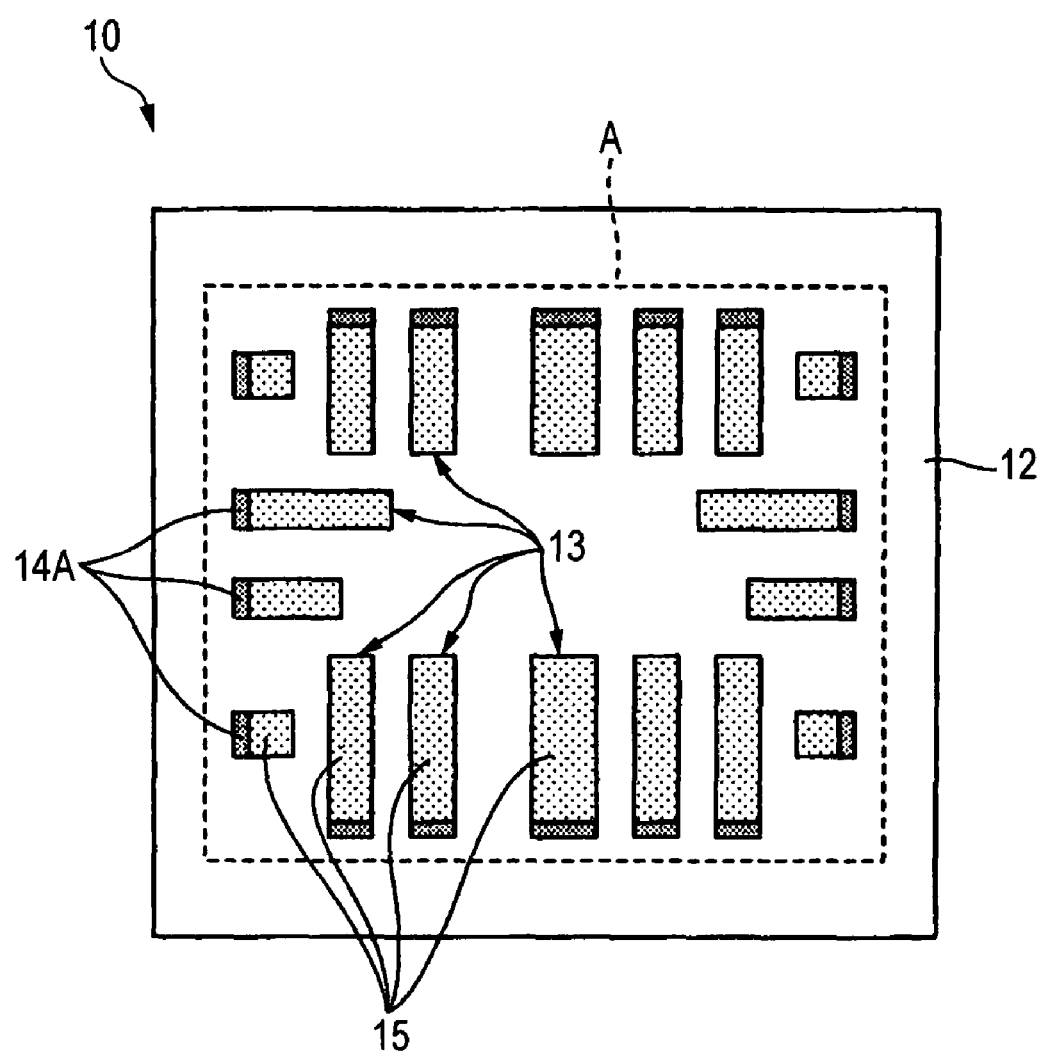
FIG. 5 is a diagram viewing the wiring substrate shown in FIG. 4 from the plane.

FIG. 4 is a sectional diagram of a wiring substrate according to a first exemplary embodiment of the invention, and FIG. 5 is a diagram viewing the wiring substrate shown in FIG. 4 from the plane. Numeral A shown in FIGS. 4 and 5 shows a region (hereinafter called "a wiring formation region A") in which plural wirings 13 are formed.

Referring to FIGS. 4 and 5, a wiring substrate 10 of the first exemplary embodiment has a substrate 11, an insulating layer 12 and wirings 13. The substrate 11 is formed in plate shape. The insulating layer 12 and the wirings 13 are disposed on the substrate 11. As a material of the substrate 11, for example, silicon can be used.

The insulating layer 12 is disposed so as to cover an upper surface 11A of the substrate 11. The insulating layer 12 insulates a region between the substrate 11 and the wirings 13. As the insulating layer 12, for example, an oxide film or a nitride film can be used.

The wiring 13 is constructed of a first seed layer 14 and a conductive metal 15. The first seed layer 14 is disposed on the insulating layer 12 corresponding to the wiring formation region A. The first seed layer 14 has a first seed layer portion 14A which is not covered with the conductive metal 15 in the vicinity of the outer periphery of the wiring formation region A. The first seed layer portion 14A is the portion to which a second seed layer 22 described below (see FIGS. 10 and 18) is connected in the case of forming the conductive metal 15. The first seed layer 14 is a power feeding layer for precipitating and growing the conductive metal 15 by an electrolytic plating method. As the first seed layer 14, for example, a Ti/Cu laminated film in which a Ti layer and a Cu layer are sequentially laminated on the insulating layer 12 or a Cr/Cu laminated film in which a Cr layer and a Cu layer are sequentially laminated on the insulating layer 12 can be used. A thickness of the first seed layer 14 can be set at, for example, about 0.1 to 1 μm.

The conductive metal 15 is disposed on the first seed layer 14 excluding the first seed layer portion 14A. As the conductive metal 15, for example, Cu can be used. A thickness of the conductive metal 15 is set at, for example, about 5 to 30 μm. The conductive metal 15 is formed by the electrolytic plating method.

FIGS. 6 to 17 are diagrams showing manufacturing steps of the wiring substrate according to the first exemplary embodiment of the invention. In FIGS. 6 to 17, the same numerals are assigned to the same components as those of the wiring substrate 10 of the first exemplary embodiment. Also, numeral B shown in FIGS. 6 to 17 shows a region (hereinafter called "a wiring substrate formation region B") of a substrate 18 in which the wiring substrate 10 is formed, and numeral C shows a cut position (hereinafter called "a cut position C") in the case of cutting the substrate 18, respectively.

Figure 10:
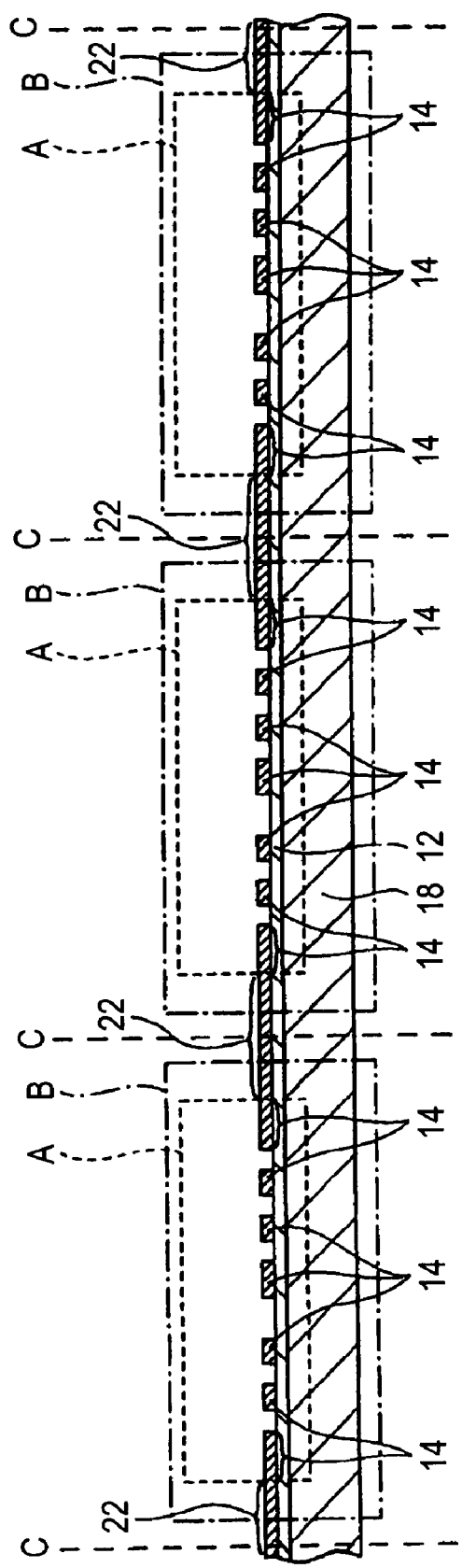
FIG. 10 is a diagram showing a manufacturing step of the wiring substrate according to the first exemplary embodiment of the invention (fifth).
Figure 14:
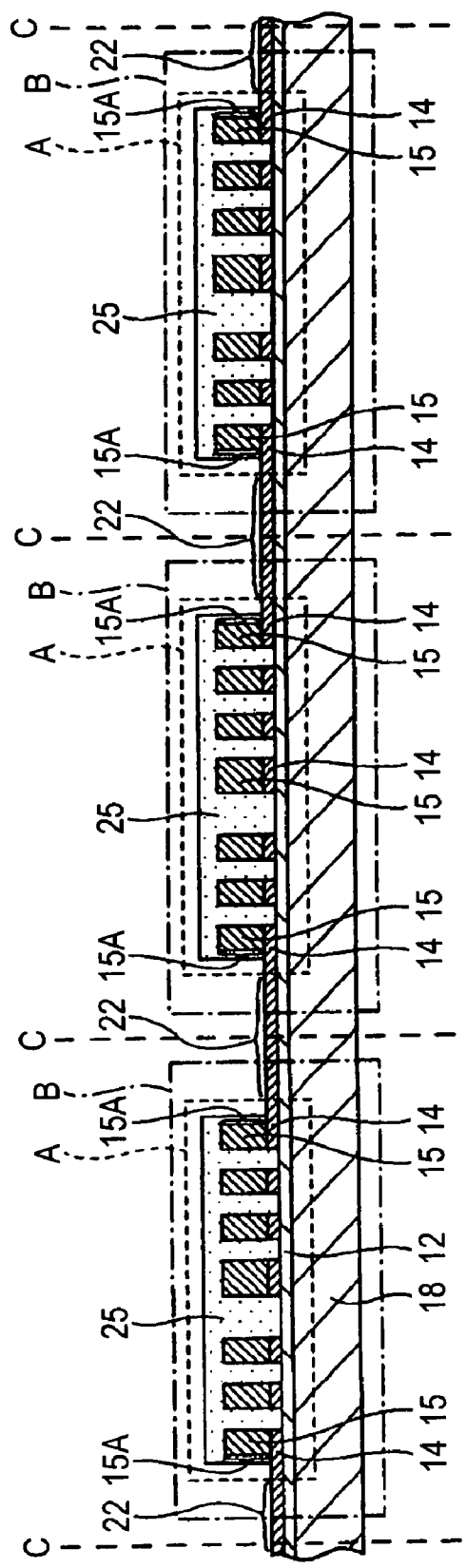
FIG. 14 is a diagram showing a manufacturing step of the wiring substrate according to the first exemplary embodiment of the invention (ninth).
Figure 18:
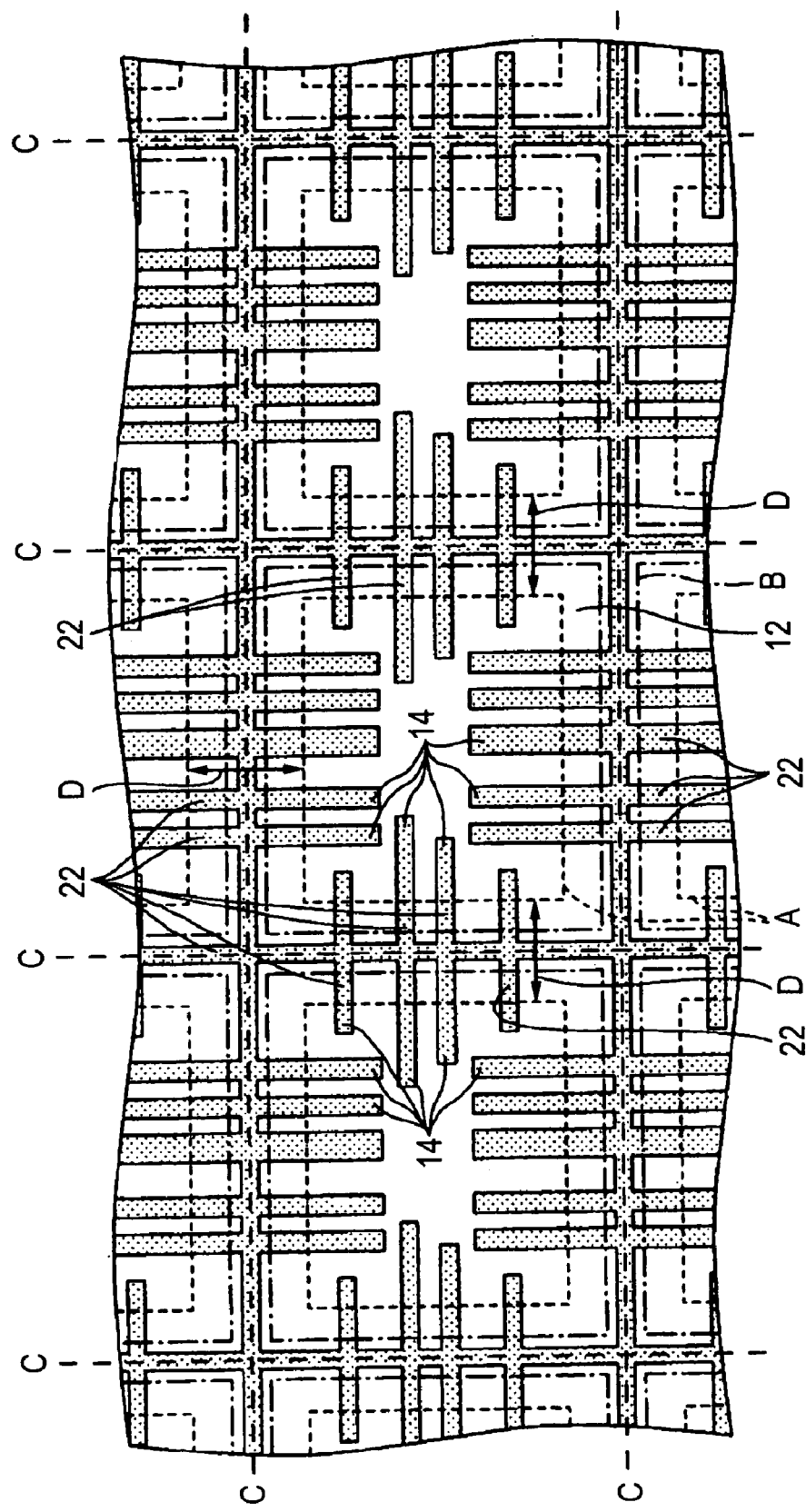
FIG. 18 is a diagram viewing a structural body shown in FIG. 10 from the plane.
Figure 19:
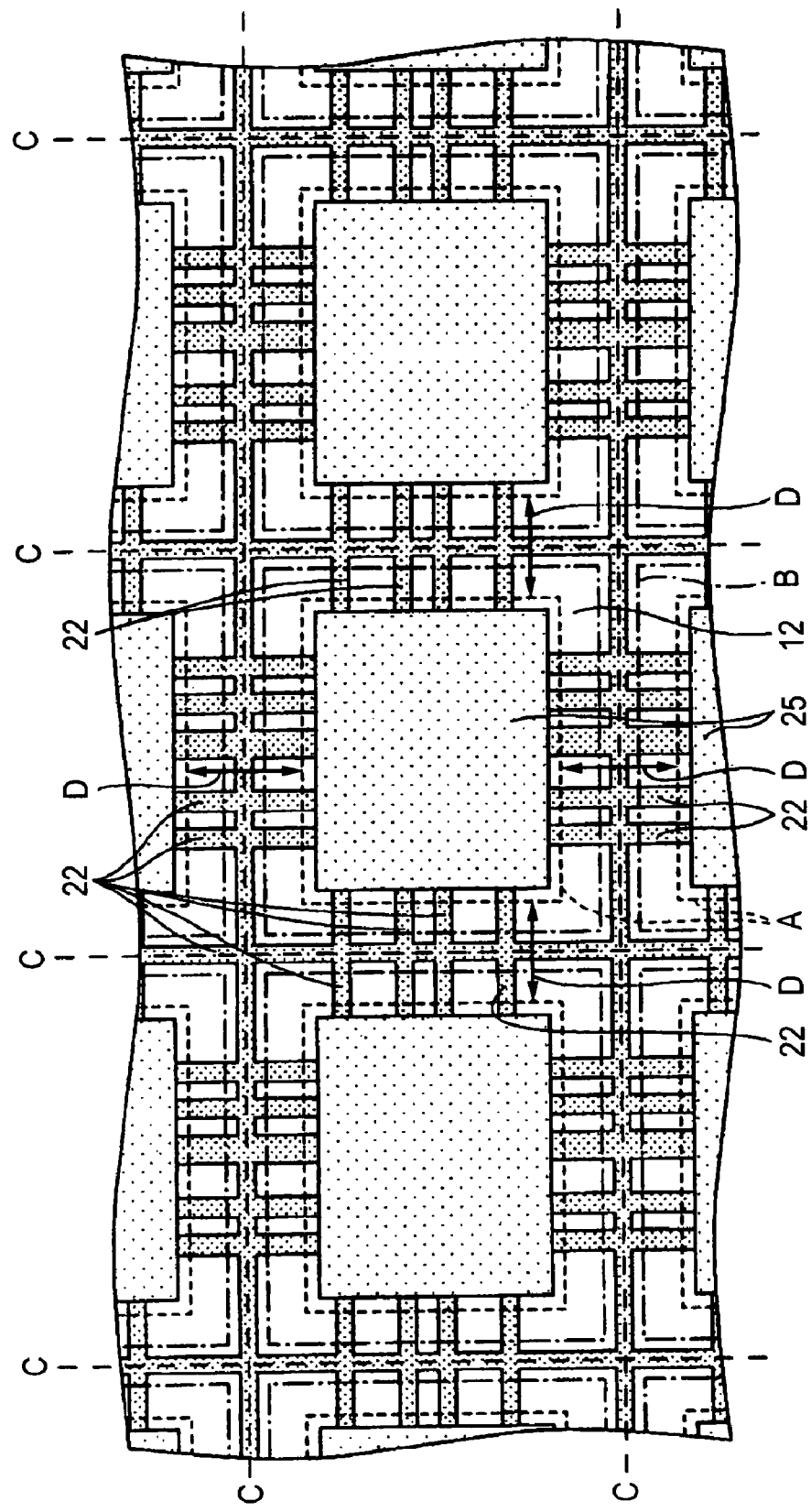
FIG. 19 is a diagram viewing a structural body shown in FIG. 14 from the plane.
Figure 20:
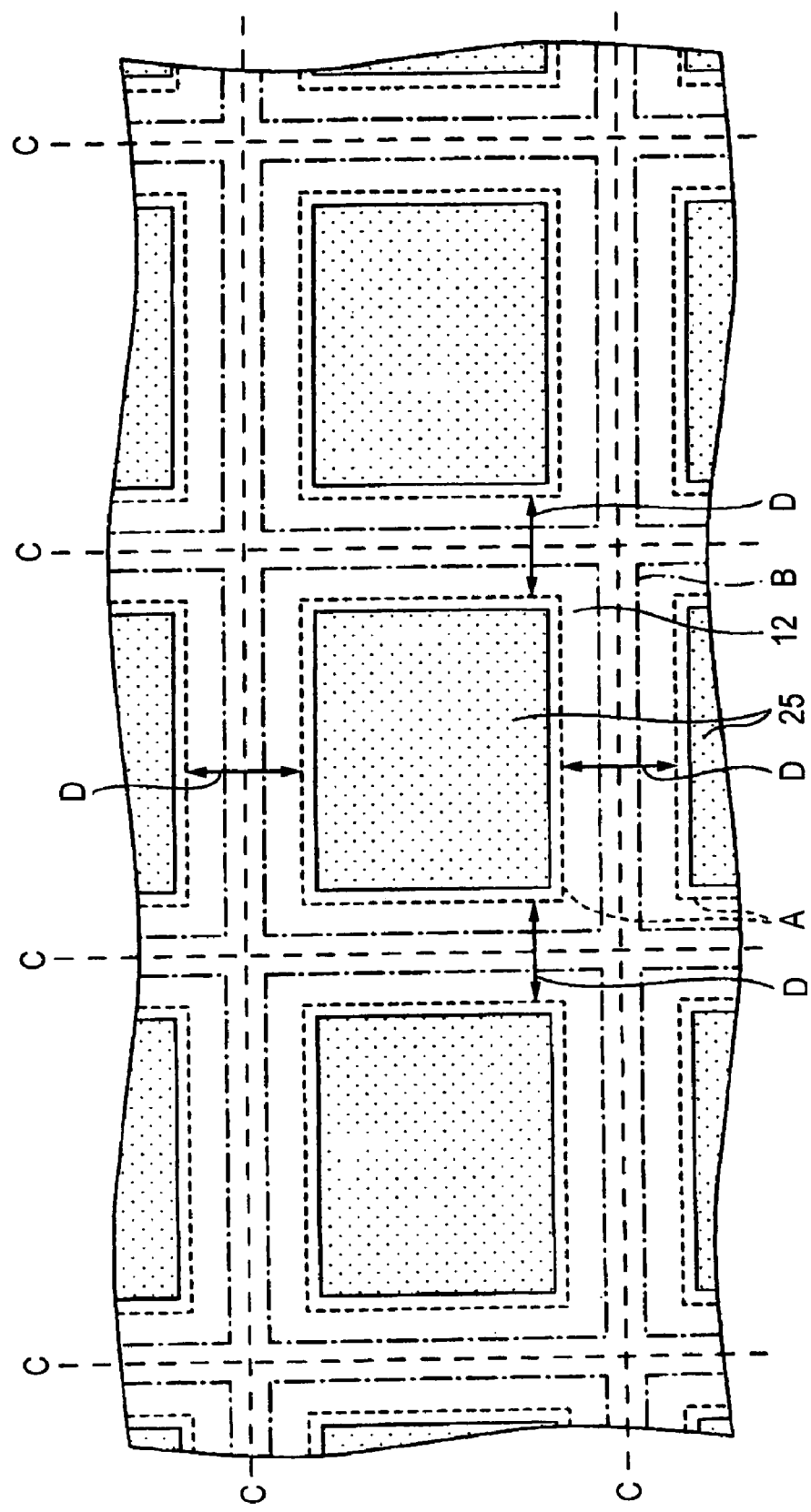
FIG. 20 is a diagram viewing a structural body shown in FIG. 15 from the plane.

FIG. 18 is a diagram viewing a structural body shown in FIG. 10 from the plane, and FIG. 19 is a diagram viewing a structural body shown in FIG. 14 from the plane. Also, FIG. 20 is a diagram viewing a structural body shown in FIG. 15 from the plane.

A method of forming wiring 13 according to the first exemplary embodiment will be described by taking the case of manufacturing plural wiring substrates 10 in a substrate 18 as an example with reference to FIGS. 6 to 20.

Figure 6:
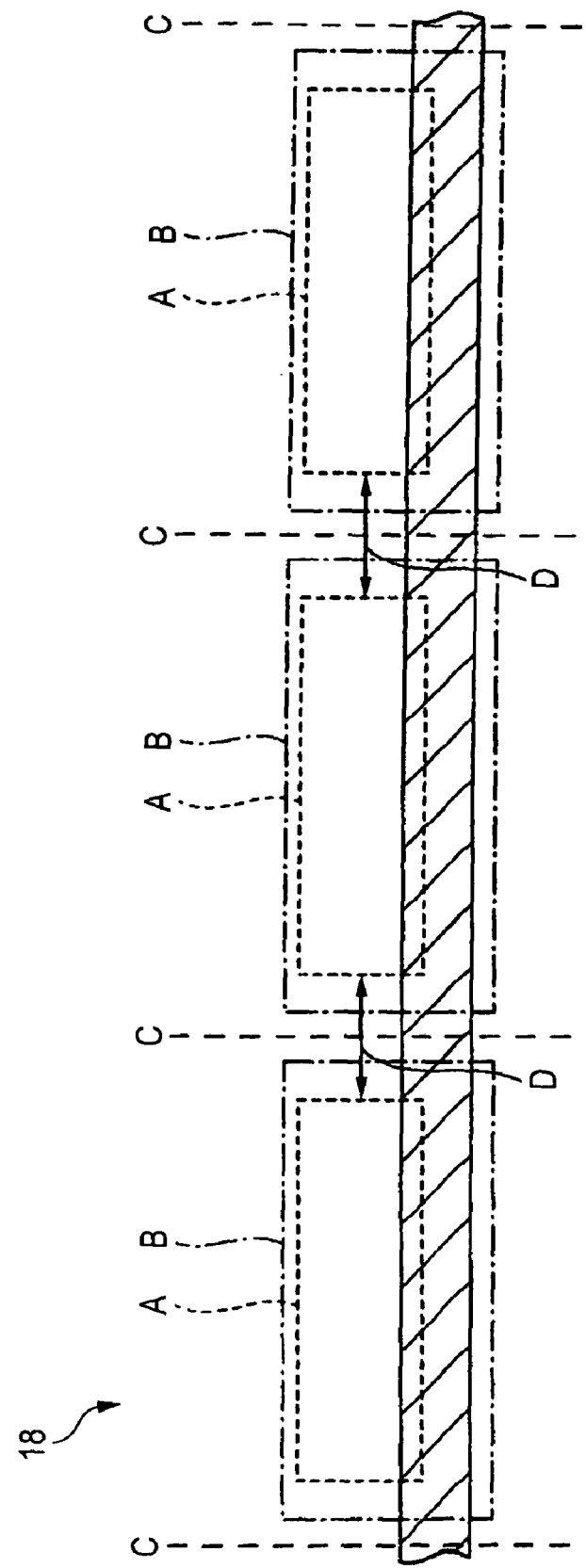
FIG. 6 is a diagram showing a manufacturing step of the wiring substrate according to the first exemplary embodiment of the invention (first).

First, in a step shown in FIG. 6, the substrate 18 having plural wiring substrate formation regions B in which wiring substrates 10 are formed is prepared. The substrate 18 is cut in a step shown in FIG. 17 described below and forms plural substrates 11. Wiring formation regions A are respectively disposed inside the plural wiring substrate formation regions B. A distance D between the wiring formation region A and the other adjacent wiring formation region A can be set at, for example, about 100 to 200 μm. Therefore, a space width between the wiring formation regions A is very wide. As a material of the substrate 18, for example, silicon can be used.

Figure 7:
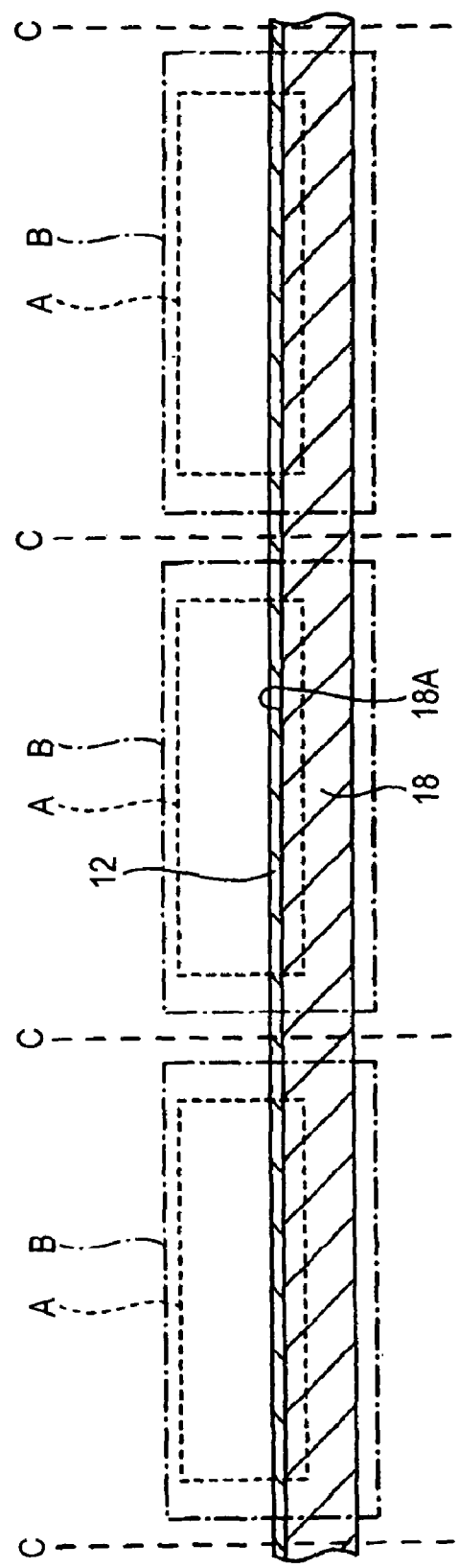
FIG. 7 is a diagram showing a manufacturing step of the wiring substrate according to the first exemplary embodiment of the invention (second).

Next, in a step shown in FIG. 7, an insulating layer 12 is formed so as to cover an upper surface 11A of the substrate 18. As the insulating layer 12, for example, an oxide film or a nitride film can be used. The insulating layer 12 can be formed by, for example, a CVD (Chemical Vapor Deposition) method.

Figure 8:
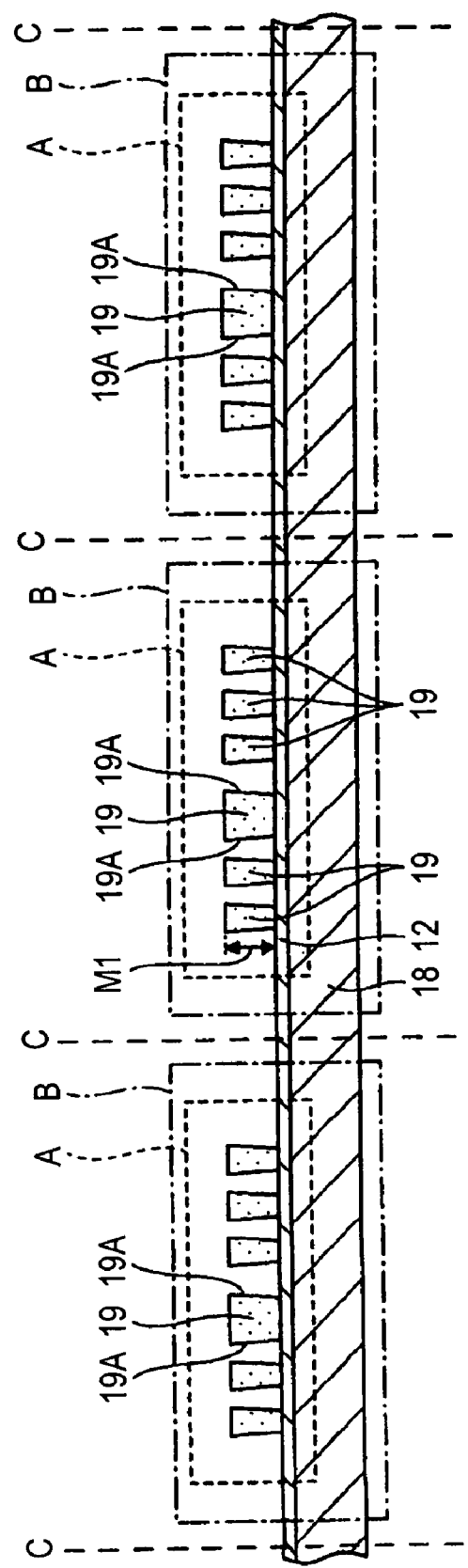
FIG. 8 is a diagram showing a manufacturing step of the wiring substrate according to the first exemplary embodiment of the invention (third).

Then, in a step shown in FIG. 8, resist films 19 for liftoff are formed on the insulating layer 12 other than the insulating layer 12 portion corresponding to a formation region of first and second seed layers 14, 22. At this time, a thickness M1 of the resist film 19 for liftoff is formed so as to become thicker than a thickness of the first and second seed layers 14, 22. The resist film 19 for liftoff is a resist film in which the side surface 19A is formed in an inverse tapered shape by exposure and development processing. As the resist film 19 for liftoff, for example, a resist for liftoff of the AZ5200 series (manufactured by AZ Electronic Materials Inc.) can be used.

Figure 9:
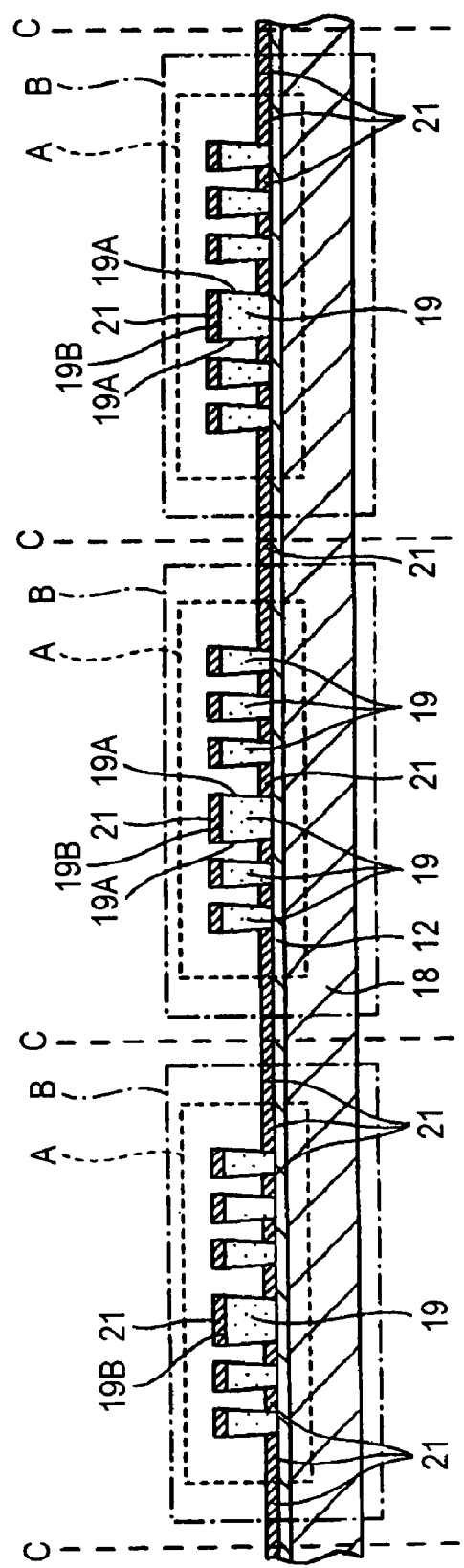
FIG. 9 is a diagram showing a manufacturing step of the wiring substrate according to the first exemplary embodiment of the invention (fourth).

Then, in a step shown in FIG. 9, a metal film 21 is formed on a structural body shown in FIG. 8. At this time, the side surface 19A of the resist film 19 for liftoff is formed in the inverse tapered shape, so that the metal film 21 is formed on only an upper surface 19B of the resist film 19 for liftoff and the insulating layer 12 exposed from the resist film 19 for liftoff. Among the metal film 21, the metal film 21 formed on the insulating layer 12 forms the first and second seed layers 14, 22. The metal film 21 can be formed by, for example, a PVD (Physical Vapor Deposition) method. As the metal film 21, for example, a Ti/Cu laminated film in which a Ti layer and a Cu layer are sequentially laminated on the insulating layer 12 or a Cr/Cu laminated film in which a Cr layer and a Cu layer are sequentially laminated on the insulating layer 12 can be used. A thickness of the metal film 21 can be set at, for example, about 0.1 to 1 μm.

Then, in a step shown in FIG. 10, the metal film 21 formed on the upper surface 19B of the resist film 19 for liftoff is removed together with the resist film 19 for liftoff (liftoff method). In other words, first and second seed layers 14, 22 are formed by the liftoff method (a seed layer formation step).

Consequently, the first seed layers 14 are formed on the insulating layer 12 corresponding to the plural wiring formation regions A, and the second seed layers 22 are formed on the insulating layer 12 located between the plural wiring formation regions A (see FIG. 18). The second seed layers 22 are formed integrally with the first seed layers 14. As a result of this, power can be collectively fed to the first seed layers 14 formed in the plural wiring formation regions A through the second seed layers 22 by feeding power to the second seed layers 22. A terminal (not shown) for power feeding is connected to the second seed layers 22.

By disposing the second seed layers 22 formed integrally with the first seed layers 14 formed in the plural wiring formation regions A thus, conductive metals 15 can be formed on the first seed layers 14 formed in the plural wiring formation regions A by one power feeding.

Figure 11:
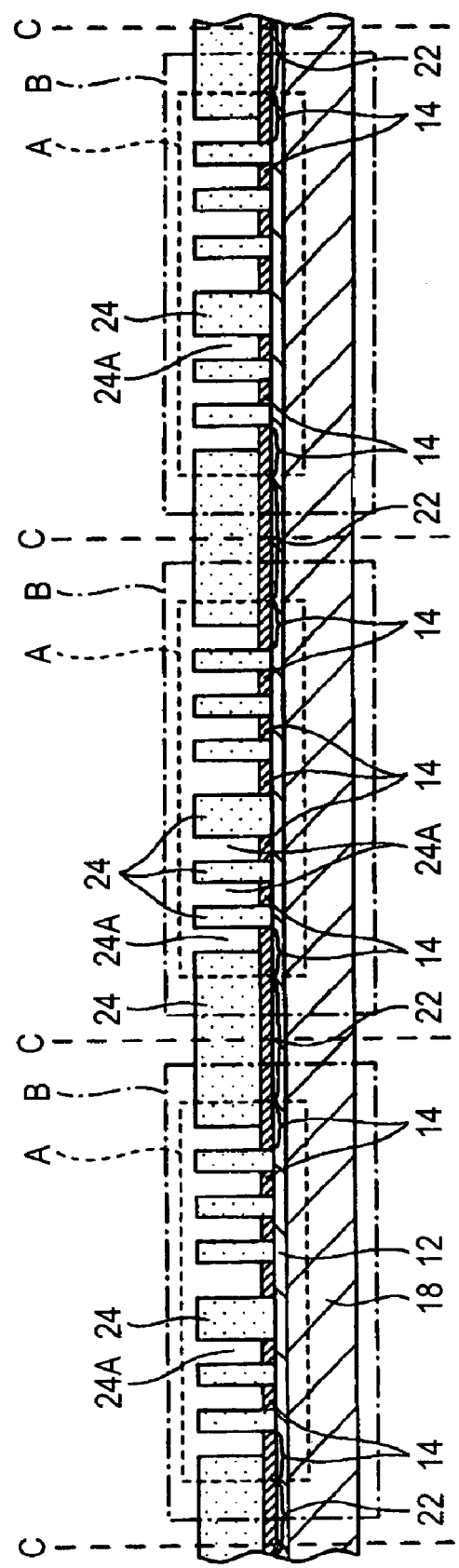
FIG. 11 is a diagram showing a manufacturing step of the wiring substrate according to the first exemplary embodiment of the invention (sixth).

Then, in a step shown in FIG. 11, a resist film 24 having openings 24A is formed on a structural body shown in FIG. 10 (a resist film formation step). The openings 24A are openings for exposing only the first seed layers 14. The resist film 24 is disposed so as to cover the second seed layers 22.

By covering the second seed layers 22 by the resist film 24 thus, the conductive metals 15 can be prevented from being precipitated and grown on the second seed layers 22 in a step shown in FIG. 12 described below, so that the second seed layers 22 can easily be removed in a step shown in FIG. 15 described below.

Figure 12:
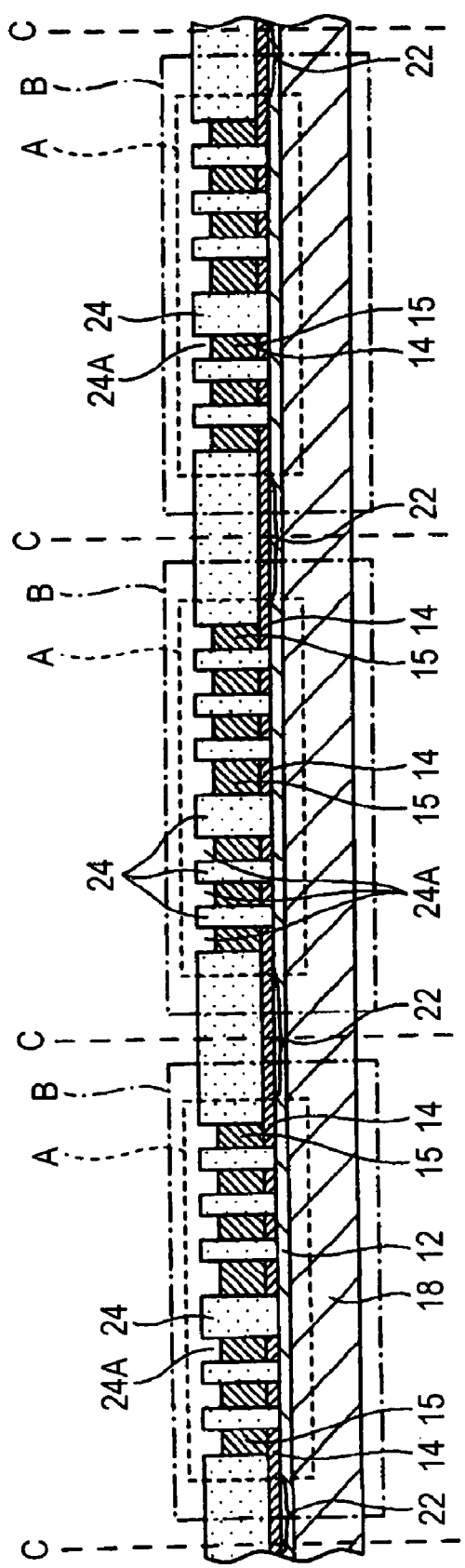
FIG. 12 is a diagram showing a manufacturing step of the wiring substrate according to the first exemplary embodiment of the invention (seventh).

Then, in the step shown in FIG. 12, the conductive metals 15 are precipitated and grown on the first seed layers 14 by an electrolytic plating method using the first and second seed layers 14, 22 as power feeding layers (a conductive metal formation step).

Consequently, a structural body (structural body made of the first seed layers 14 and the conductive metals 15) corresponding to wirings 13 is formed on the insulating layer 12. At this stage, the structural body corresponding to the wirings 13 formed in the plural wiring formation regions A is electrically connected to a structural body corresponding to wirings 13 formed in another wiring formation region A through the second seed layers 22. Then, in a step shown in FIG. 13, the resist film 24 is removed.

Figure 13:
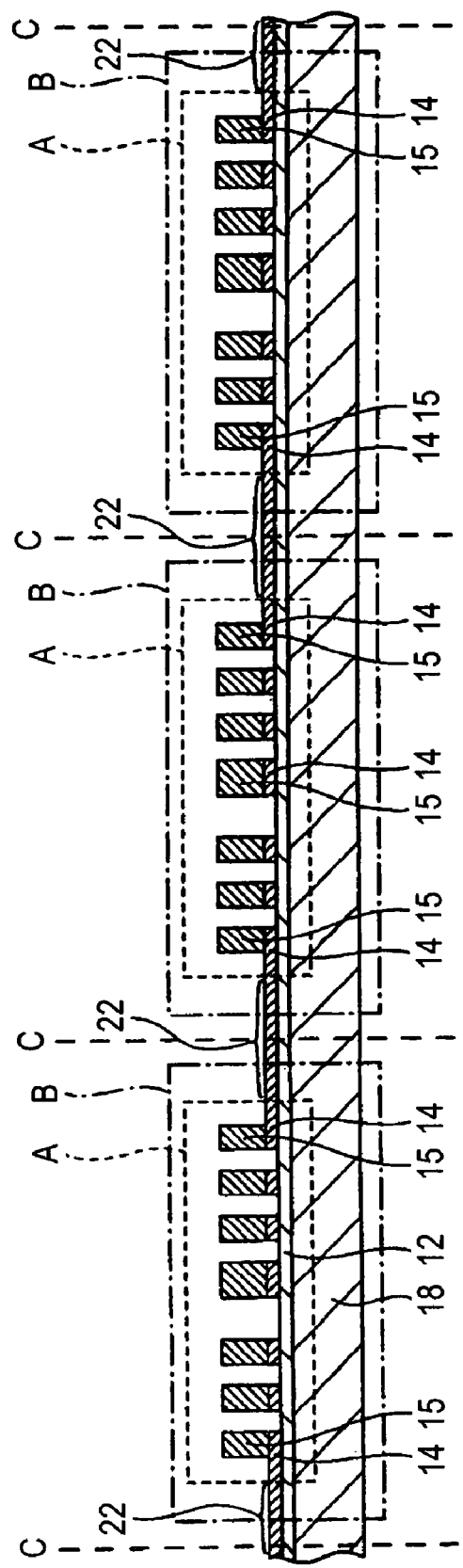
FIG. 13 is a diagram showing a manufacturing step of the wiring substrate according to the first exemplary embodiment of the invention (eighth).

Then, in a step shown in FIG. 14, a resist film 25 is formed so as to cover the structural body portion corresponding to the plural wiring formation regions A among the structural body shown in FIG. 13 (see FIG. 19). The resist film 25 is a mask in the case of removing the second seed layers 22 by anisotropic etching. Therefore, the second seed layers 22 are exposed from the resist film 25.

Also, the resist film 25 could be formed so as to cover side walls 15A of the conductive metals 15 located in the vicinity of the outer periphery of the wiring formation region A. By covering the side walls 15A of the conductive metals 15 located in the vicinity of the outer periphery of the wiring formation region A with the resist film 25 thus, the side walls 15A of the conductive metals 15 can be prevented from being etched in the step shown in FIG. 15 described below.

Figure 15:
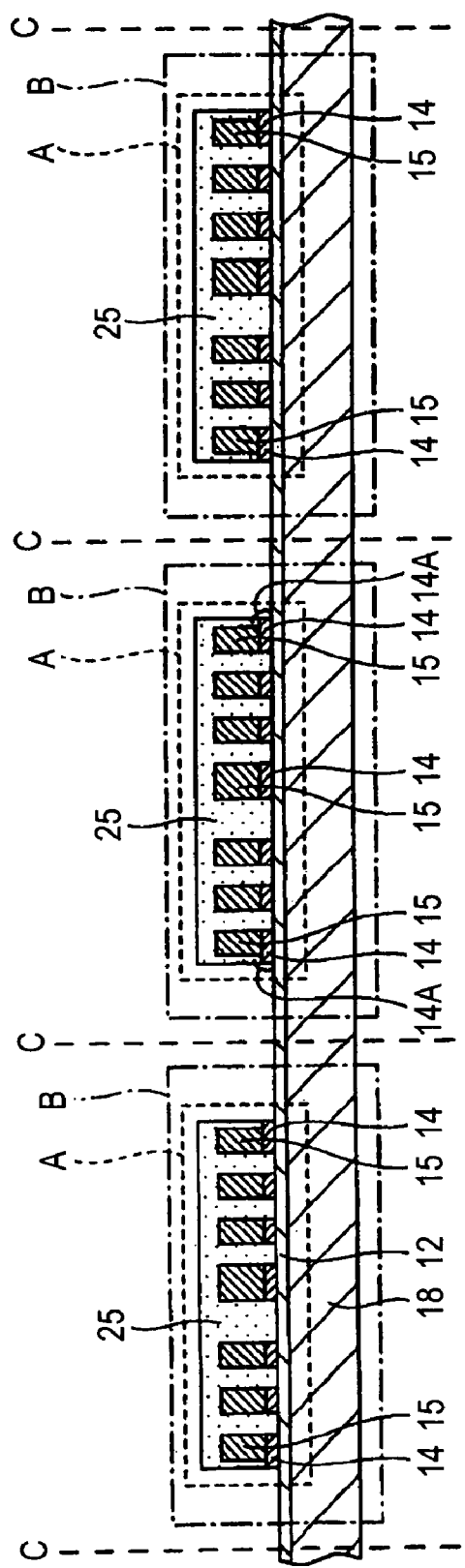
FIG. 15 is a diagram showing a manufacturing step of the wiring substrate according to the first exemplary embodiment of the invention (tenth).

Then, in the step shown in FIG. 15, the second seed layers 22 are removed by anisotropic etching using the resist film 25 as a mask (a second seed layer removal step).

Consequently, plural wirings 13 are formed in the plural wiring formation regions A, and the wirings 13 formed in the plural wiring formation regions A are respectively insulated from wirings 13 formed in other wiring formation regions A (see FIG. 20).

Figure 16:
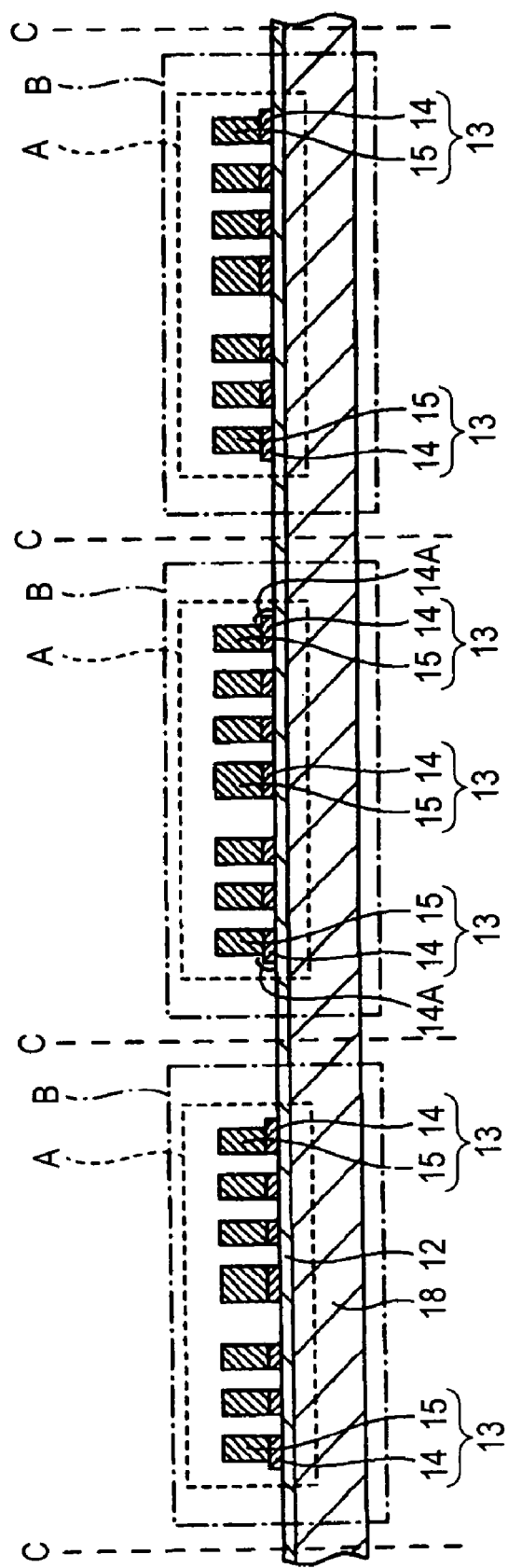
FIG. 16 is a diagram showing a manufacturing step of the wiring substrate according to the first exemplary embodiment of the invention (eleventh).

Then, in a step shown in FIG. 16, the resist film 25 is removed. Consequently, structural bodies corresponding to wiring substrates 10 are respectively formed in plural wiring substrate formation regions B.

Figure 17:
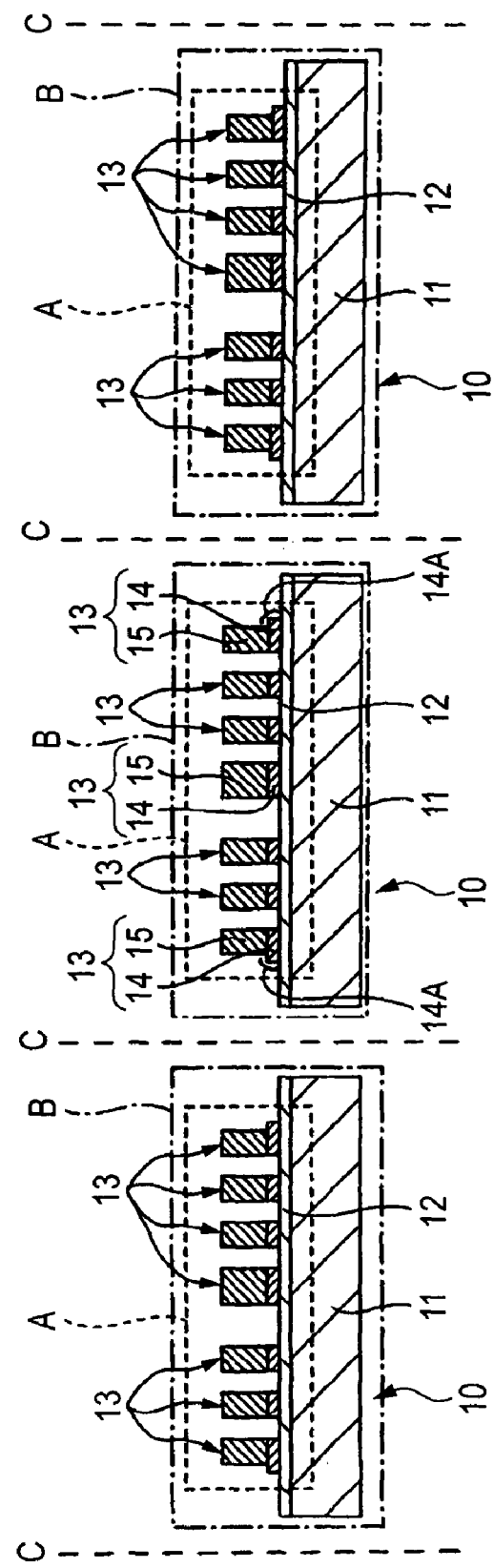
FIG. 17 is a diagram showing a manufacturing step of the wiring substrate according to the first exemplary embodiment of the invention (twelfth).

Then, in a step shown in FIG. 17, the structural bodies shown in FIG. 16 are cut along cut positions C. Consequently, the plural wiring substrates 10 are manufactured.

According to formation of the wirings of the present embodiment, by forming the first seed layers 14 by a liftoff method, the first seed layers 14 are not formed in a region with a narrow space width between the wirings 13, so that the need for a step of removing the first seed layers 14 disposed in the region with the narrow space width between the wirings 13 is eliminated, so that the microscopic wirings 13 can be formed even when the space width between the wirings 13 is narrow.

Figure 1:
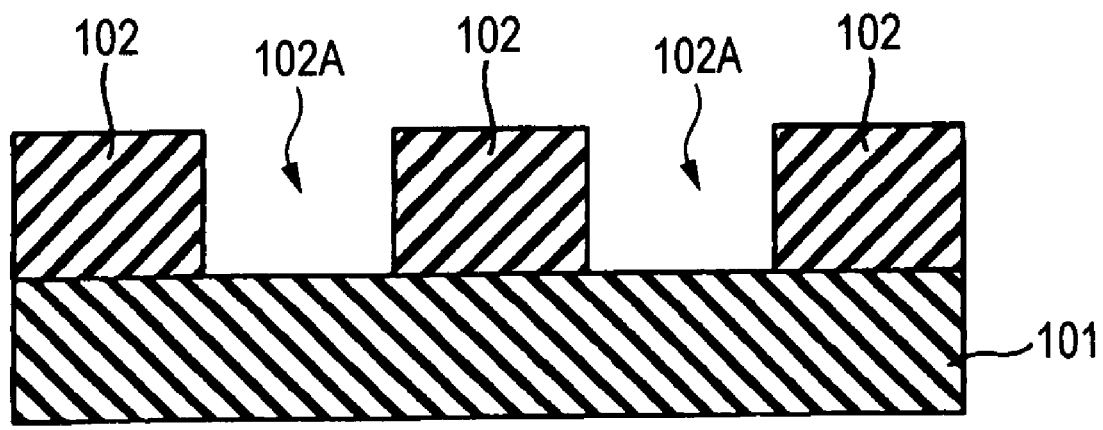
FIG. 1 is a diagram showing a related-art wiring formation step (first).
Figure 2:
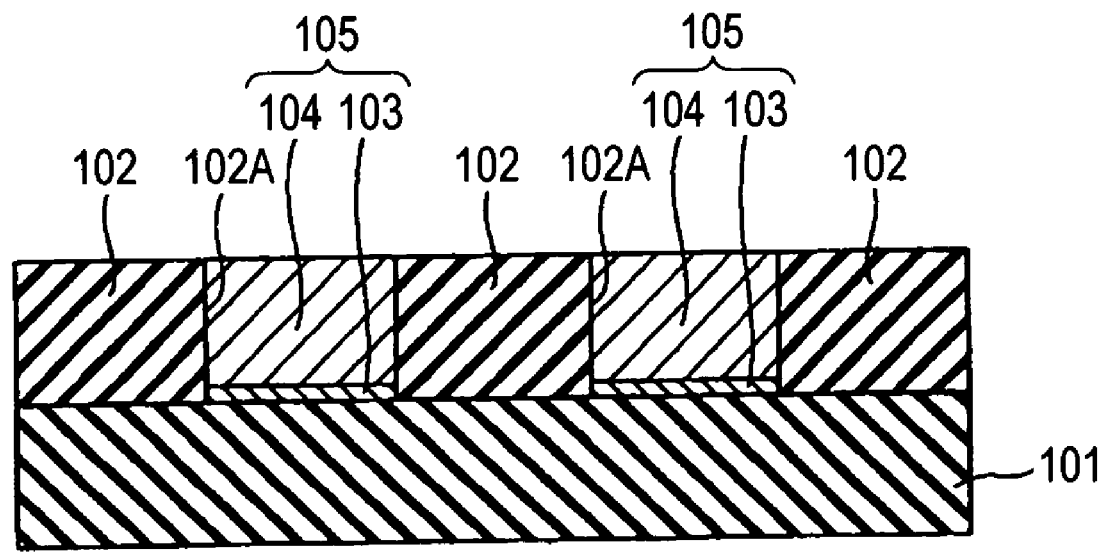
FIG. 2 is a diagram showing the related-art wiring formation step (second).
Figure 3:
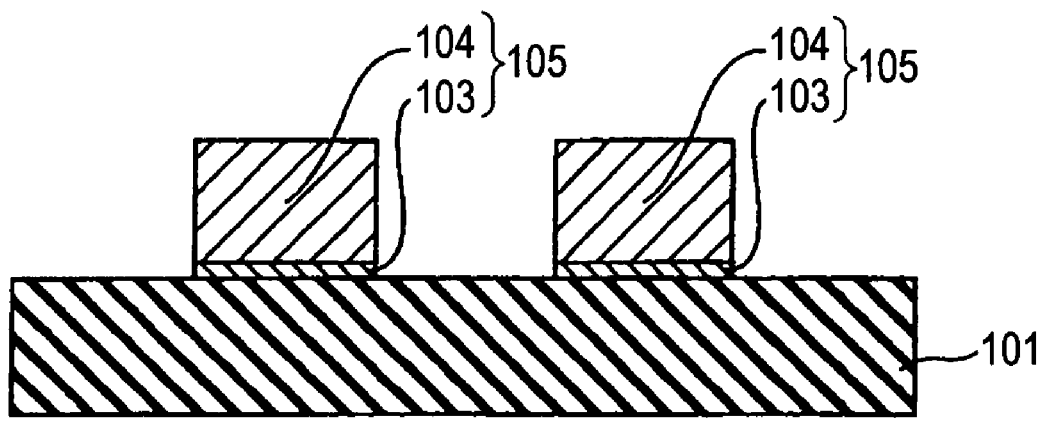
FIG. 3 is a diagram showing the related-art wiring formation step (third).

Also, by forming the wirings 13 by precipitating and growing the conductive metals 15 on the first seed layers 14 using an electrolytic plating method, a thickness of the wirings 13 can be made thicker than that of the wirings 105 (see FIGS. 1 to 3) in which the conductive metals 104 are precipitated and grown using an electroless plating method.

Further, by precipitating and growing the conductive metals 15 using the electrolytic plating method, the conductive metals 15 can be precipitated and grown at speed higher than that of the electroless plating method, so that productivity of the wirings 13 can be improved.

In addition, in the embodiment, the case of disposing the resist film 25 so as to cover the side walls 15A of the conductive metals 15 of the side in which the second seed layers 22 are disposed in the step shown in FIG. 14 has been described as an example, but a thickness of the second seed layers 22 is considerably thinner than a thickness of the conductive metals 15, so that damage to the conductive metals 15 in the second seed layer removal step is small. As a result of that, the resist film 25 may be formed so as to expose the side walls 15A of the conductive metals 15. Also, in the case of forming the resist film 25 thus, the first seed layer portion 14A is not formed and a sectional structure of a wiring substrate in this case is formed as shown in a wiring substrate 30 (see FIG. 21) of a second exemplary embodiment described below.

Also, in the embodiment, the case of using the resist film 19 for liftoff in the step shown in FIG. 8 has been described as an example, but a general resist film may be used instead of the resist film 19 for liftoff if its side surface can be formed into the inverse tapered shape.

Second Embodiment

Figure 21:
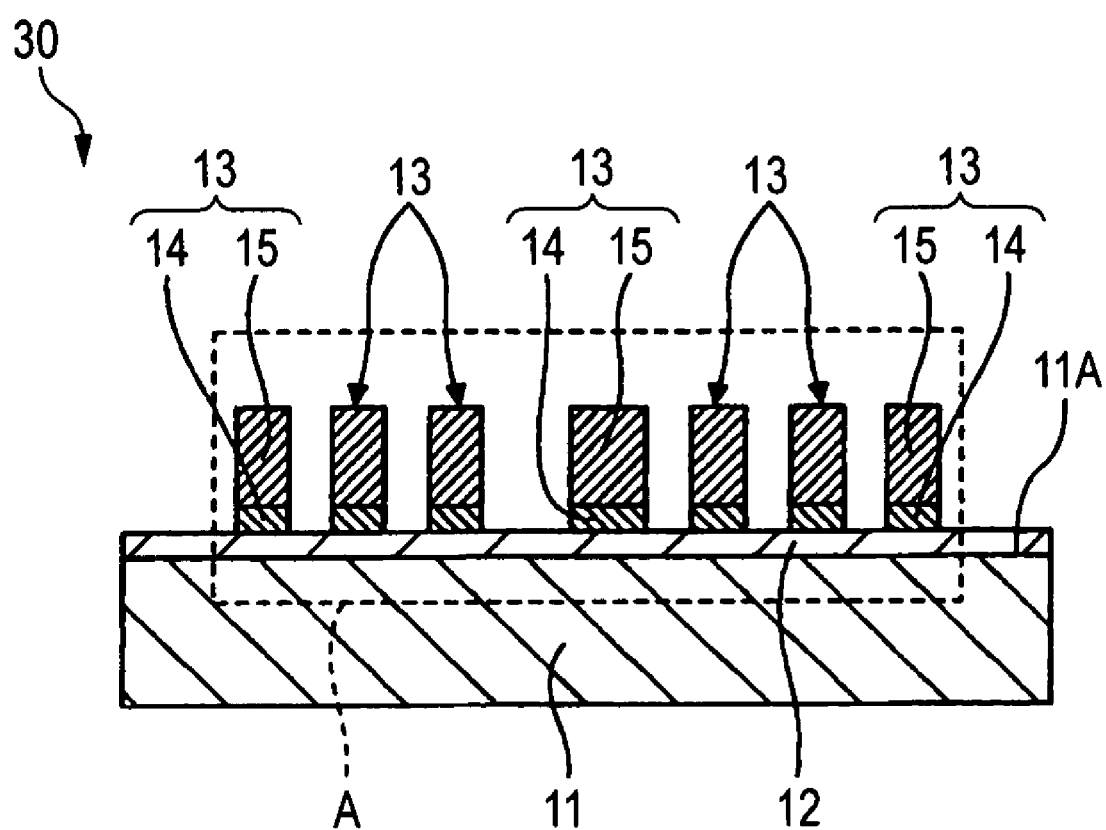
FIG. 21 is a sectional diagram of a wiring substrate according to a second exemplary embodiment of the invention.

FIG. 21 is a sectional diagram of a wiring substrate according to a second exemplary embodiment of the invention. In FIG. 21, the same numerals are assigned to the same components as those of the wiring substrate 10 of the first exemplary embodiment.

Referring to FIG. 21, a wiring substrate 30 of the second exemplary embodiment is constructed in a manner similar to the wiring substrate 10 except that there is no first seed layer portion 14A disposed in the wiring substrate 10 of the first exemplary embodiment.

FIGS. 22 to 27 are diagrams showing manufacturing steps of the wiring substrate according to the second exemplary embodiment of the invention. In FIGS. 22 to 27, the same numerals are assigned to the same components as those of the wiring substrate 30 of the second exemplary embodiment.

A method of forming wiring 13 according to the second exemplary embodiment will be described by taking the case of manufacturing plural wiring substrates 30 in a substrate 18 as an example with reference to FIGS. 22 to 27.

First, the structural body shown in FIG. 10 is formed by performing processing similar to the steps shown in FIGS. 6 to 10 described in the first exemplary embodiment. In other words, first and second seed layers 14, 22 are formed by a liftoff method (a seed layer formation step).

Figure 22:
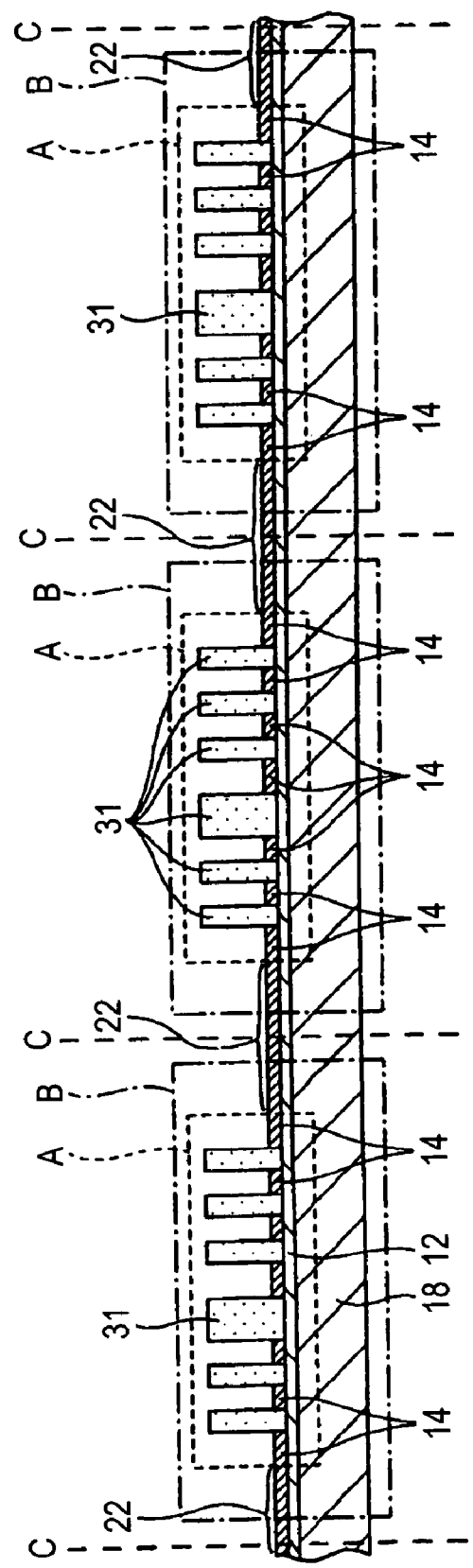
FIG. 22 is a diagram showing a manufacturing step of the wiring substrate according to the second exemplary embodiment of the invention (first).
Figure 23:
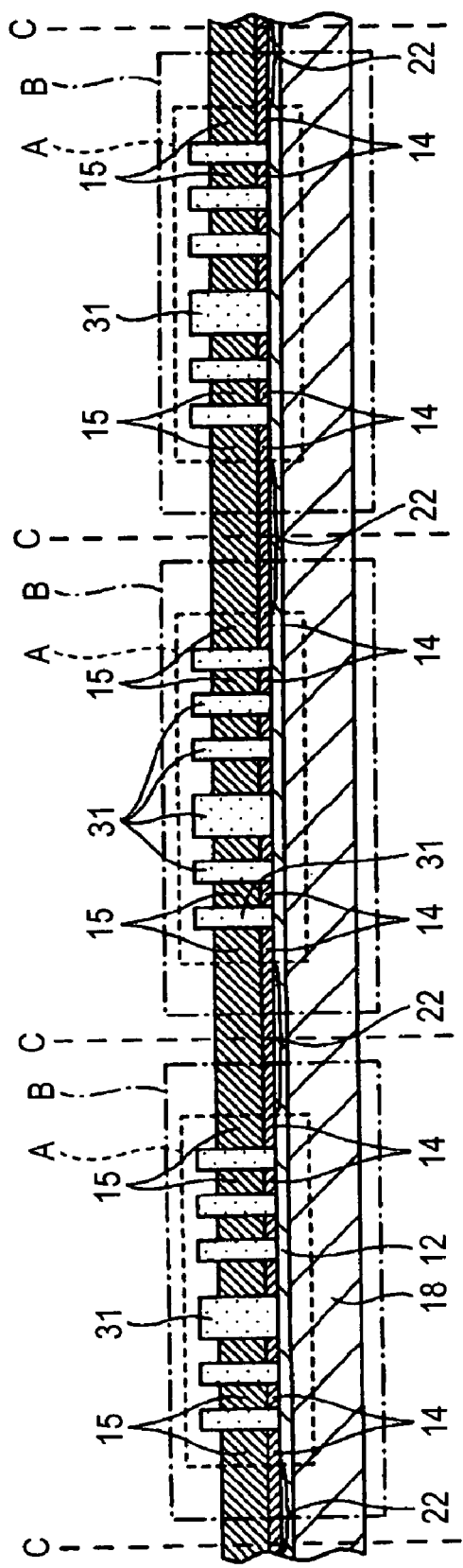
FIG. 23 is a diagram showing a manufacturing step of the wiring substrate according to the second exemplary embodiment of the invention (second).

Next, in a step shown in FIG. 22, a resist film 31 is formed on an insulating layer 12 exposed from the first and second seed layers 14, 22. Then, in a step shown in FIG. 23, conductive metals 15 are precipitated and grown on the first and second seed layers 14, 22 by an electrolytic plating method using the first and second seed layers 14, 22 as power feeding layers (a conductive metal formation step).

Figure 24:
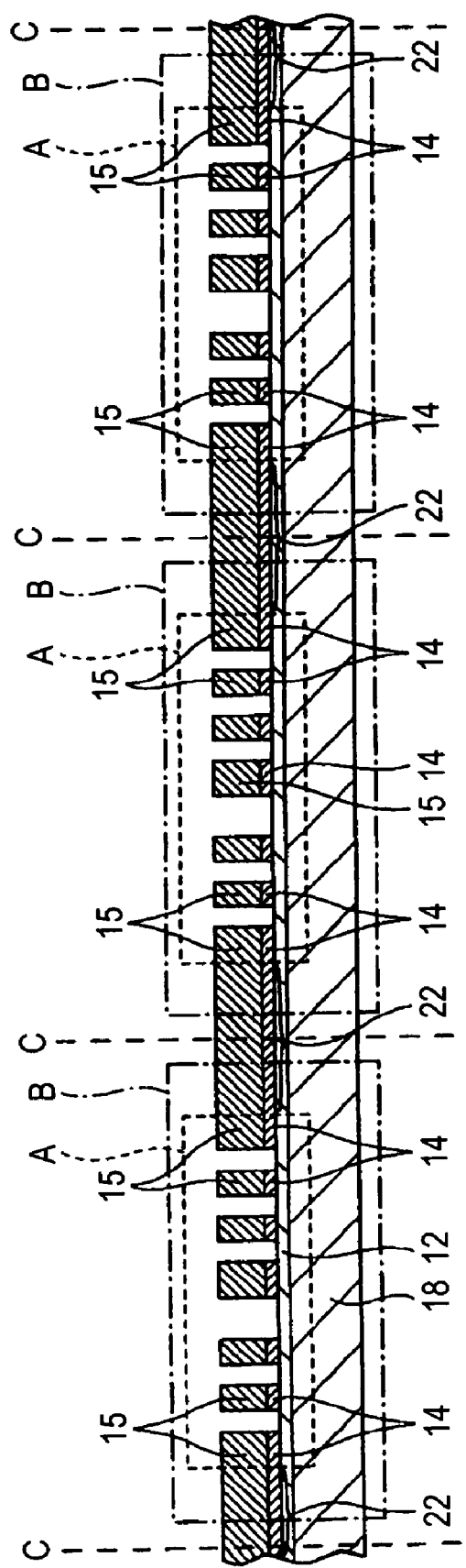
FIG. 24 is a diagram showing a manufacturing step of the wiring substrate according to the second exemplary embodiment of the invention (third).
Figure 25:
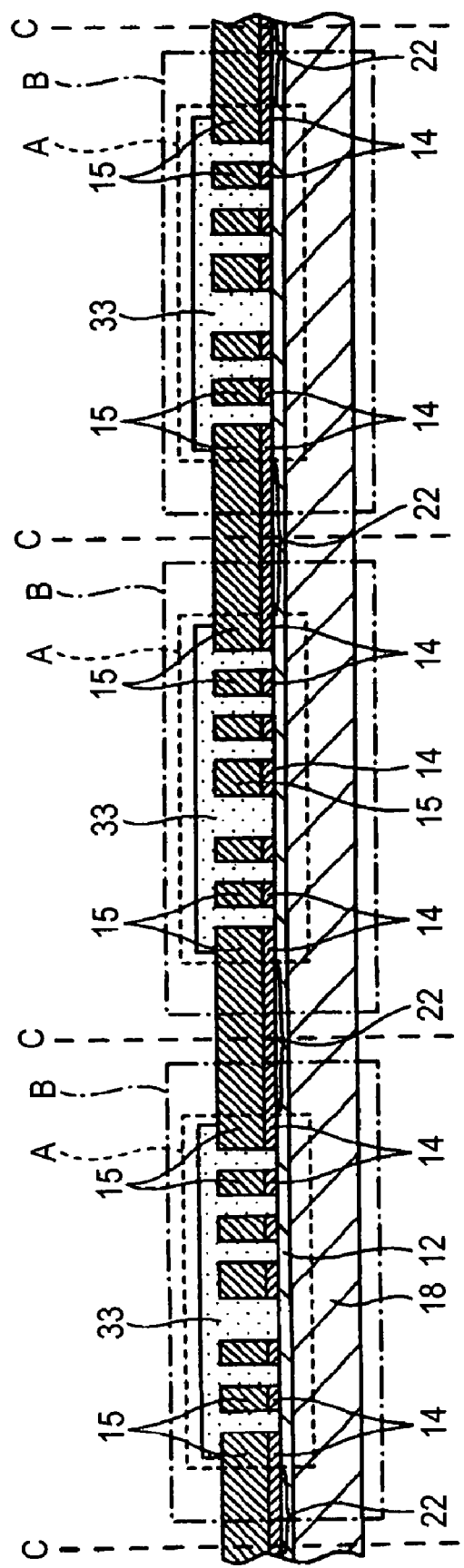
FIG. 25 is a diagram showing a manufacturing step of the wiring substrate according to the second exemplary embodiment of the invention (fourth).

Then, in a step shown in FIG. 24, the resist film 31 is removed. Then, in a step shown in FIG. 25, a resist film 33 is formed so as to cover a wiring formation region A of a structural body shown in FIG. 24.

Figure 26:
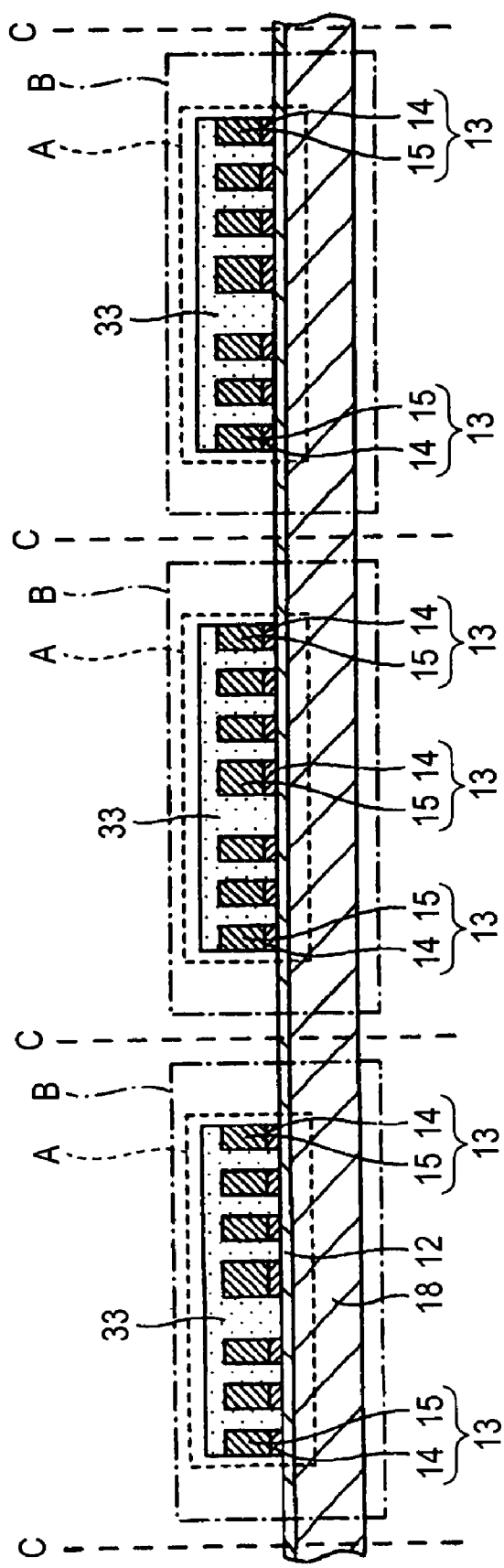
FIG. 26 is a diagram showing a manufacturing step of the wiring substrate according to the second exemplary embodiment of the invention (fifth).

Then, in a step shown in FIG. 26, the second seed layers 22 and the conductive metals 15 formed on the second seed layers 22 are removed by anisotropic etching using the resist film 33 as a mask (a second seed layer removal step).

Consequently, plural wirings 13 are formed in the plural wiring formation regions A. Also, the wirings 13 formed in the plural wiring formation regions A are respectively insulated from wirings 13 formed in other wiring formation regions A.

Figure 27:
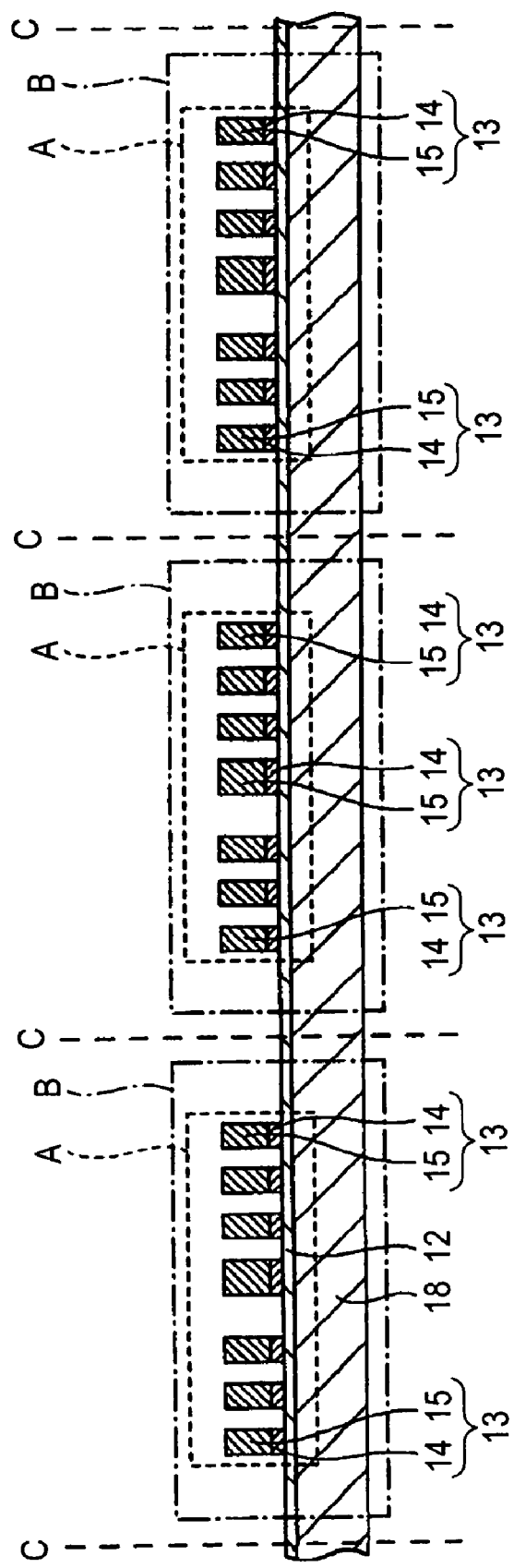
FIG. 27 is a diagram showing a manufacturing step of the wiring substrate according to the second exemplary embodiment of the invention (sixth).

Then, in a step shown in FIG. 27, the resist film 33 is removed. Thereafter, a structural body shown in FIG. 27 is cut along cut positions C by a technique similar to the step shown in FIG. 17 described in the first exemplary embodiment. Consequently, the plural wiring substrates 30 are manufactured.

According to formation of the wirings of the present embodiment, by forming the first seed layers 14 by a liftoff method, the first seed layers 14 are not formed in a region with a narrow space width between the wirings 13, so that the need for a step of removing the first seed layers 14 disposed in the region with the narrow space width between the wirings 13 is eliminated, so that the microscopic wirings 13 can be formed even when the space width between the wirings 13 is narrow.

Also, by forming the wirings 13 by precipitating and growing the conductive metals 15 on the first seed layers 14 using an electrolytic plating method, a thickness of the wirings 13 can be made thicker than that of the wirings 105 (see FIGS. 1 to 3) in which the conductive metals 104 are precipitated and grown using an electroless plating method.

Further, by precipitating and growing the conductive metals 15 using the electrolytic plating method, the conductive metals 15 can be precipitated and grown at speed higher than that of the electroless plating method, so that productivity of the wirings 13 can be improved.

In the embodiment, the case of using the resist film 31 in the step shown in FIG. 22 has been described as an example, but the resist film 31 can be omitted. For example, if the thickness of the conductive metals 15 to be precipitated and grown does not need to be thick (for example, 5 μm), the steps of forming and removing the resist film 31 shown in FIG. 22-24 can be omitted. In this case, after the structural body shown in FIG. 10 is formed by performing processing similar to the steps shown in FIGS. 6 to 10 described in the first embodiment, the conductive metals 15 are precipitated and grown on the first and second seed layers 14, 22 by an electrolytic plating method using the first and second seed alters 14, 22 as power feeding layers without the resist film 31 so that the structural body shown in FIG. 24 is formed.

The preferred embodiments of the invention have been described above in detail, but the invention is not limited to such specific embodiments, and various modifications and changes can be made within the gist of the invention described within the scope of the claims.

In addition, in the first and second exemplary embodiments, the case of forming the wirings 13 in the wiring substrates 10, 30 has been described as an example, but the method of forming the wirings 13 according to the first and second exemplary embodiments can also be applied to wirings disposed in a semiconductor device of CSP (Chip Size Package) etc., a silicon interposer, MEMS (Micro electro mechanical systems), etc. requiring miniaturization of the wirings 13.

According to the invention, it can be applied as a method of forming wiring disposed in a semiconductor device, a silicon interposer, MEMS (Micro electro mechanical systems), a wiring substrate, etc.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of forming wiring, comprising:
a seed layer formation step of forming a seed layer on an insulating layer disposed on a substrate by a liftoff method;

a conductive metal formation step of precipitating and growing a conductive metal on the seed layer by an electrolytic plating method using the seed layer as a power feeding layer, wherein the liftoff method includes forming a resist film with a predetermined pattern on the insulating layer, forming a metal film on the resist film and the insulating layer exposed from the resist film, and removing the resist film together with the metal film formed on an upper surface of the resist film, wherein the substrate has plural wiring formation regions, in each of which plural wirings are formed, the seed layer has a first seed layer disposed on a portion of the insulating layer corresponding to the plural wiring formation regions and a second seed layer disposed on a portion of the insulating layer located between the plural wiring formation regions, the second seed layer is formed integrally and simultaneously with the first seed layer, and the conductive metal is precipitated and grown on the first seed layer by the electrolytic plating method using the second seed layer as the power feeding layer; and a resist film formation step of forming a resist film for covering the second seed layer before the conductive metal formation step.

2. The method of forming wiring as claimed in claim 1, wherein the second seed layer surrounds the respective plural wiring formation regions.

3. The method of forming wiring as claimed in claim 1, further comprising:

a second seed layer removal step of removing the second seed layer after the conductive metal formation step.

4. The method of forming wiring as claimed in claim 1, wherein the resist film has openings exposing only the first seed layer and covers the insulating layer exposed from the first and second seed layers.

* * * * *